United States Patent [19]

Berke

[11] 4,417,218

[45] Nov. 22, 1983

[54] LINEARIZING CIRCUIT FOR A HIGH FREQUENCY VOLTAGE CONTROLLED OSCILLATOR

[75] Inventor: Herbert Berke, Maitland, Fla.

[73] Assignee: The United States of America as represented by the Secretary of the Navy, Washington, D.C.

[21] Appl. No.: 275,474

[22] Filed: Jun. 19, 1981

[51] Int. Cl.³ ............................................. H03B 23/00
[52] U.S. Cl. .................................... 331/178; 307/228; 328/184; 358/158
[58] Field of Search ...................... 331/4, 10, 20, 178; 358/148, 158; 369/60, 62; 307/228, 260, 271; 328/14, 184

[56] References Cited

U.S. PATENT DOCUMENTS

| | | | |
|---|---|---|---|
| 4,039,806 | 8/1977 | Fredriksson et al. | 328/14 X |
| 4,129,832 | 12/1978 | Neal et al. | 331/178 X |
| 4,335,442 | 6/1982 | Backe | 328/14 X |

Primary Examiner—Stanley D. Miller
Assistant Examiner—W. R. Paxman
Attorney, Agent, or Firm—Robert F. Beers; Robert W. Adams; Robert J. Veal

[57] ABSTRACT

A circuit for linearizing the oscillator sweep output frequency signal of a voltage controlled oscillator is disclosed. The voltage controlled oscillator is driven by the output of an op amp, which amplifies and filters the output of a D/A converter. The D/A converter responds to preselected 8-bit words, stored in an EPROM, so as to produce a desired output frequency at each memory address. The addresses, in turn, are provided by a combination of gates, counters, input signals and a clock.

9 Claims, 5 Drawing Figures

LINEARIZING CIRCUIT FOR A HIGH FREQUENCY VOLTAGE CONTROLLED OSCILLATOR

BACKGROUND OF THE INVENTION

1. Field of the Invention

This invention relates generally to oscillators. More particularly, this invention relates to a circuit for linearizing a high frequency voltage controlled oscillator.

2. Description of the Prior Art

Voltage controlled oscillators are today commonly used to generate frequency sweep signals wherein the output signal frequency is continuously varied over a selected frequency range as a function of time. Fir mnost applications it is important to have the output frequency signals change at a constant linear rate.

Heretofore, substantial efforts have been made in developing control circuits for linearizing voltage controlled oscillators. Most such control circuits of the prior art are well known to the artisan; hence, a discussion thereof is unnecessary at this time.

However, there are several prior art control circuits which are of some significance, inasmuch as they indirectly concern subject matter that is pertinent to the linearizing circuit for a high frequency voltage controlled oscillator constituting the instant invention.

For example, U.S. Pat. No. 4,038,612 to R. P. Borofka and L. R. Barton discloses a circuit which makes use of a controllable oscillator (VCO) responsive to a control voltage ramp. Accurately controlled error-sensing means are provided for detecting variations of the instantaneous frequency of a frequency ramp generated by the VCO at predetermined accurately-timed points. The discrete errors at these plural points throughout the frequency ramp are computed and integrated over a plurality of sweep cycles and then are used to compensate the control voltage ramp.

U.S. Pat. No. 4,129,832 to G. W. Neal and R. M. Montgomery dicloses a circuit for linearizing a voltage controlled oscillator which has a random access digital controlled memory coupled with the voltage control terminal of a voltage controlled oscillator to be linearized, a power divider coupled with the output terminal of the oscillator, a mixer coupled with the power divider by two conductive lines of differing time delays, and an X-Y axis signal display coupled with the mixer, whereby the memory may be programmed to input a ramp control signal to the oscillator and a difference frequency signal detected in the chirp output signal generated by the oscillator and compared with a frequency signal on the display to detect nonlinearities in the chirp output signal of the voltage controlled oscillator which may be substantially reduced by programming of the control memory.

Although the aforementioned circuits of the prior art have linearized voltage controlled oscillators, their degree of success has been limited. Typically, utilization of these prior art devices have achieved linearization in the range of ±0.5% with the upper limit being approximately ±0.1%. In addition, the time involved in performing a linearization operation on individual oscillators has been quite substantial. Furthermore, the aforementioned devices of the prior art do not operate in exactly the same manner as the subject invention and contain a combination of elements that is somewhat different from the present invention.

SUMMARY OF THE INVENTION

The subject invention overcomes some of the disadvantages of the prior art, including those mentioned above, in that it comprises a relatively simple circuit for linearizing the output characteristic curve of a voltage controlled oscillator.

Included in the subject invention is an input terminal adapted to receive a horizontal sync signal having a series of uniformly spaced horizontal sync pulses, and timing means for producing fifty, eight-bit digital addresses, which are repetitive whenever the aforesaid timing means receives at the input thereof a sync pulse of the horizontal sync signal.

Each digital address is then supplied to an erasable programmable read only memory which provides in response to each digital address an eight-bit digital word. Each digital word is converted to an analog voltage by a digital-to-analog converter, and supplied to the aforementioned voltage controlled oscillator. The voltage controlled oscillator, in turn, provides in response to each analog voltage, a frequency signal such that a linear oscillator sweep output frequency signal is formed at the output of the voltage controlled oscillator between sync pulses of the horizontal sync signal.

DESCRIPTION OF THE PREFERRED EMBODIMENT

Figure 1:
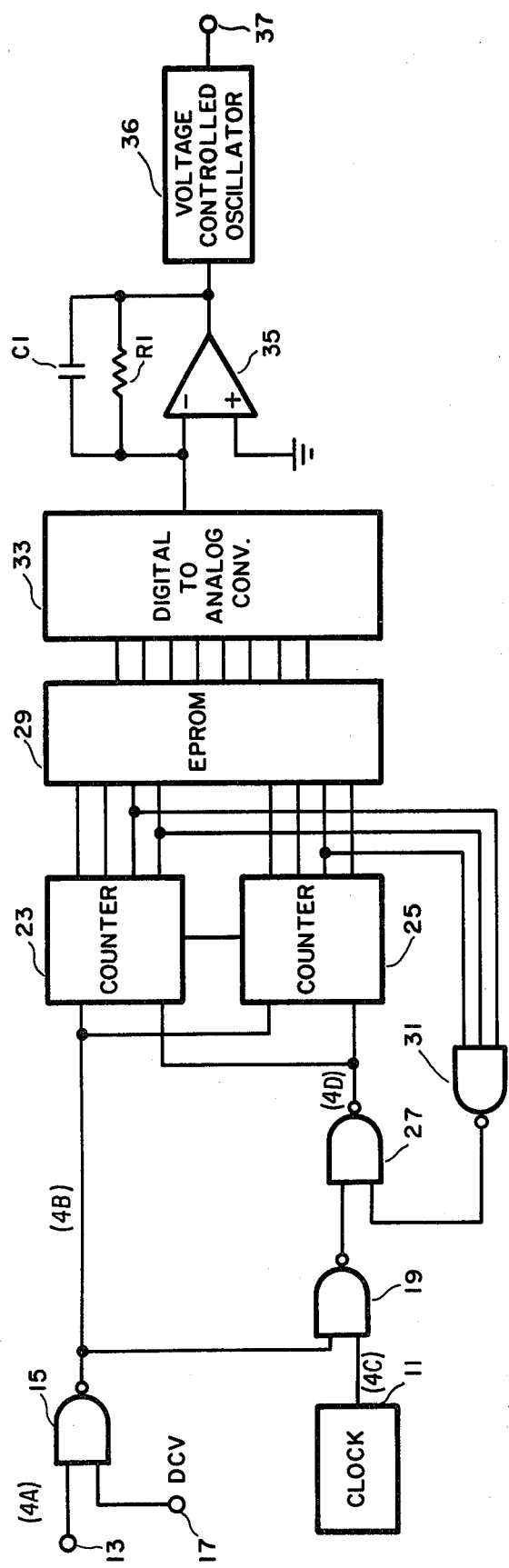
FIG. 1 is a combination block and schematic diagram of the linearizing circuit for a voltage controlled oscillator constituting the subject invention.

The preferred embodiment of the subject invention will now be discussed in some detail in conjunction with all of the figures of the drawing wherein like parts are designated by like reference numerals, insofar as it is possible and practical to do so.

Referring now to FIG. 1, the invention is shown as including a variable frequency clock 11, which may be operated at any frequency that is appropriate for the invention's intended use. Nevertheless, it has been determined that the preferred operational frequency of clock 11 is 2 megahertz. In addition, the subject invention includes an input terminal 13 adapted to receive a horizontal sync signal. The aforementioned sync signal may, in turn, have a frequency of either 15 kilohertz or 30 kilohertz, the frequencies respectively of a 525 and 1023 line television system. Nevertheless, for the purpose of illustration, it may be assumed that a 30 kilohertz sync signal is supplied to input terminal 13.

Connected to input terminal 13 is the first input of a NAND gate 15, the second input of which is connected to the output of a direct current voltage source 17. The output of NAND gate 15 is connected to the first input of a NAND gate 19, the reset input of a counter 23, and the reset input of a counter 25.

The output of clock 11 is connected to the second input of NAND gate 19, the output of which is connected to the first input of a NAND gate 27, with the output thereof connected to the clock inputs of counters 23 and 25. The four data outputs of counter 25 are respectively connected to the first, second, third, and fourth inputs of an erasable programmable read only memory (EPROM) 29, while the four outputs of counter 23 are respectively connected to the fifth, sixth, seventh, and eighth data inputs of EPROM 29. The enable output of counter 25 is connected to the enable input of counter 23. In addition, the second output of counter 25 is connected to the first input of a NAND gate 31, while the first and second outputs of counter 23 are respectively connected to the second and third inputs of NAND gate 31, the output of which is connected to the second input of NAND gate 27.

The eight outputs of EPROM 29 are respectively connected to the eight inputs of a digital-to-analog converter 33, the output of which is connected to the negative input of an operational amplifier 35, with the output thereof connected to the input of a voltage controlled oscillator 36. The output of voltage controlled oscillator 36, in turn, is connected to an output terminal 37. Connected between the negative input of operational amplifier 35 and the output thereof is the parallel combination of a resistor R1 and a capacitor C1.

Figure 2:
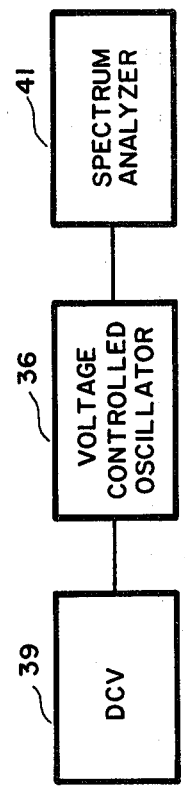
FIG. 2 is a block diagram of an electronics circuit used to generate an output characteristic curve for the voltage controlled oscillator of the invention of FIG. 1.
Figure 3:
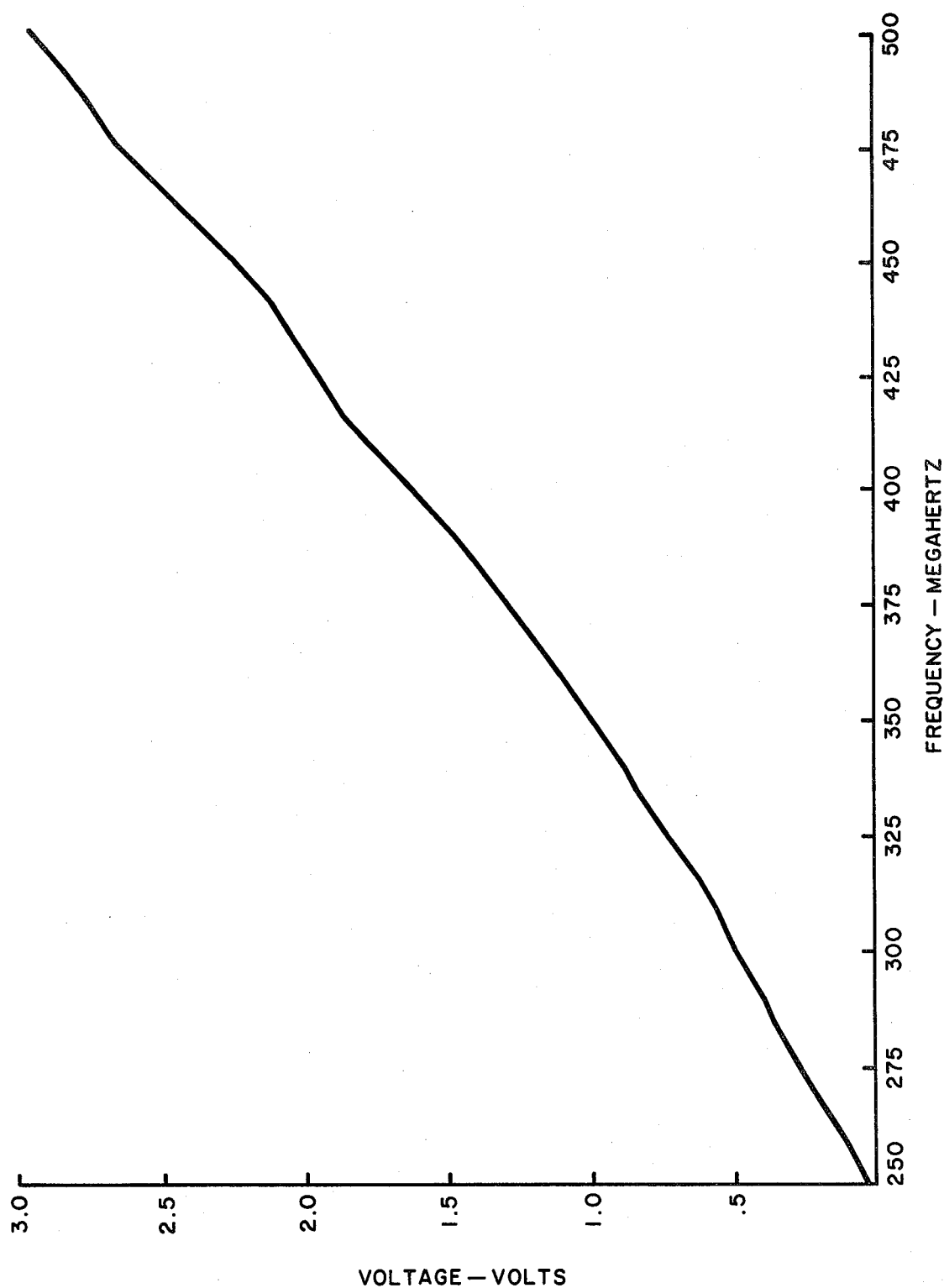
FIG. 3 is an output characteristic curve for the voltage controlled oscillator of the invention of FIG. 1 wherein the oscillator sweep output frequency varies as a function of the input voltage.

Referring now to FIG. 2, there is shown an electronics circuit which may be utilized to generate an output characteristic curve for voltage controlled oscillator 36. The aforementioned output characteristic curve of voltage controlled oscillator 36 is similar to that depicted in FIG. 3 wherein the oscillator sweep output frequency varies as a function of the input voltage in a nonlinear manner. The electronics circuit of FIG. 2, in turn, includes a variable direct current voltage source 39, the output of which is connected to the input of voltage controlled oscillator 36. The output of voltage controlled oscillator 36 is, in turn, connected to the input of a spectrum analyzer 41.

In the exemplary linearizing circuit for a high frequency voltage controlled oscillator of FIG. 1, according to the subject invention, components successfully utilized are as follows:

| Component | Model No. | Manufacturer |
| --- | --- | --- |
| 15, 19, 27 | 9002 | Fairchild |
| 23, 25 | 9316 | Fairchild |
| 29 | 2716 | Motorola |
| 31 | 9003 | Fairchild |
| 33 | 1002 | National Semiconductor |
| 35 | TL084 | Texas Instrument |
| 36 | VO-25-50 | Radio Development Labs. |

The operation of the subject invention will now be discussed in conjunction with all of the figures of the drawing.

Referring now to FIG. 2, direct current voltage source 39 provides at the output thereof a variable direct current voltage, the magnitude of which may be varied over a predetermined voltage range. The positive direct current voltage provided by direct current voltage source 39 is supplied to the input of voltage controlled oscillator 36. Voltage controlled oscillator 36 will then provide at the output thereof a frequency which is recorded by spectrum analyzer 41. The voltage applied to the input of voltage controlled oscillator 36 is, in turn, plotted as a function of the frequency appearing at the output of voltage controlled oscillator 36 such that the output characteristic curve of FIG. 3 for voltage controlled oscillator 36 is generated.

Figure 4:
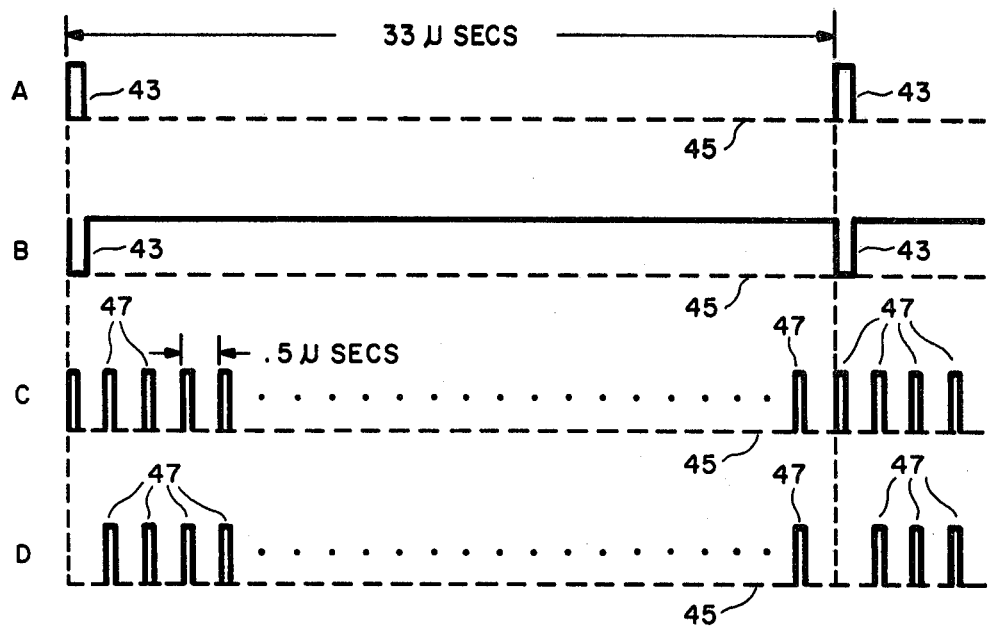
FIG. 4 depicts idealized representations of various signal waveforms which emanate from some of the components of the invention of FIG. 1.

Referring now to FIG. 1, a horizontal sync signal, similar to that depicted in FIG. 4A, is applied to input 13. The horizontal sync signal, in turn, has a series of sync pulses 43, the frequency of which is 30 kilohertz. The horizontal dashed line 45 represents the line of zero voltage for FIGS. 4A thru 4D.

Direct current voltage source 17 supplies a direct current voltage signal to NAND gate 15 such that NAND gate 15 will invert the horizontal sync signal of FIG. 4A and thereby provide at the output thereof an inverted horizontal sync signal similar to that depicted in FIG. 4B. Each sync pulse 43 of the signal of FIG. 4B will, in turn, reset counters 23 and 25 such that each data output of the aforementioned counters 23 and 25 are in the logic "0" state.

Clock 11 provides at the output thereof a clock signal similar to that depicted in FIG. 4C. The clock signal of FIG. 4C, in turn, has a plurality of pulses 47, the frequency of which is 2 megahertz. The sync signal of FIG. 4B and the clock signal of FIG. 4C are respectively supplied to the first and second inputs of NAND gate 19 which will, in turn, provide at the output thereof a clock signal the inverse of that depicted in FIG. 4D. It should be noted that each pulse 43 of the signal of FIG. 4B inhibits NAND gate 19 such that the signal of FIG. 4C will be inverted by NAND gate 19 only when the signal of FIG. 4B is in the logic "1" state. This, in turn, results in the aforementioned signal of FIG. 4D being provided at the output of NAND gate 27.

As discussed above, each pulse 43 of the signal of FIG. 4B resets counters 23 and 25 such that the data outputs of counters 23 and 25 are in the logic "0" state. This, in turn, will cause the output of NAND gate 31 to be in the logic "1" state so as to allow the signal of FIG. 4D to be output by NAND gate 27 to the clock inputs of counters 23 and 25. In addition, whenever at least one of the four data outputs of counter 25 is in the logic "0" state the enable output thereof will also be in the logic "0" state. This, in turn, will inhibit counter 23 since a logic "0" applied to the enable input thereof will prevent the aforesaid counter 23 from counting.

In response to the signal of FIG. 4B, counter 25 will count in binary to fifteen, and then the enable output of counter 25 will change from a logic "0" state to a logic "1" state, thereby enabling counter 23. Counters 23 and 25, which operate in a synchronous mode, count in binary to fifty. When the count becomes fifty, the second data output of counter 25 and the first and second data outputs of counter 23 will be in the logic "1" state, thereby causing the output of NAND gate 31 to change from a logic "1" state to a logic "0" state. This, in turn, will prevent the clock signal of FIG. 4D from passing through NAND gate 27 until the sync signal of FIG. 4B resets counters 23 and 25 such that counters 23 and 25 will again count in binary to fifty in the manner described above.

It should be noted at this time that the count provided by counters 23 and 25 may be varied from 1 to 255. Thus, for example, if it is desired to obtain a count of 96, the second and third outputs of counter 23 would be connected to a two input NAND gate, not shown, the output of which would be connected to the second input of NAND gate 27.

Each clock pulse 47 of the signal of FIG. 4D will cause counters 23 and 25 to provide at the data outputs thereof an eight bit digital address, which is then supplied to the inputs of EPROM 29. Stored within the memory of EPROM 29 are fifty eight-bit digital words with each eight-bit digital word being assigned a particular address or location in memory. The following is an illustrative table of the data which may be stored in the memory of EPROM 29.

| 8 Bit Address to Memory of EPROM 29 | 8 Bit Word Stored in Memory of EPROM 29 | Output Voltage of Converter 35 (Volts) | Output Frequency of VCO 36 (Megahertz) |
|---|---|---|---|
| 00000001 | 00010010 | .270 | 275 |
| 00000010 | 00010101 | .315 | 280 |
| 00000011 | 00011000 | .360 | 285 |
| 00000100 | 00011011 | .405 | 290 |
| 00000101 | 00011110 | .450 | 295 |
| 00000110 | 00100001 | .495 | 300 |
| 00000111 | 00100100 | .540 | 305 |
| 00001000 | 00101111 | .585 | 310 |
| 00001001 | 00101010 | .630 | 315 |
| 00001010 | 00101101 | .675 | 320 |
| 00001011 | 00110001 | .735 | 325 |
| 00001100 | 00110100 | .780 | 330 |
| 00001101 | 00111000 | .840 | 335 |
| 00001110 | 00111100 | .900 | 340 |
| 00001111 | 01000000 | .960 | 345 |
| 00010000 | 01000100 | 1.020 | 350 |
| 00010001 | 01000111 | 1.065 | 355 |
| 00010010 | 01001011 | 1.125 | 360 |
| 00010011 | 01001111 | 1.185 | 365 |
| 00010100 | 01010010 | 1.230 | 370 |
| 00010101 | 01010110 | 1.290 | 375 |
| 00010110 | 01011011 | 1.365 | 380 |
| 00010111 | 01100000 | 1.440 | 385 |
| 00011000 | 01100100 | 1.500 | 390 |
| 00011001 | 01101001 | 1.575 | 395 |
| 00011010 | 01101110 | 1.650 | 400 |
| 00011011 | 01110010 | 1.710 | 404 |
| 00011100 | 01110110 | 1.770 | 408 |
| 00011101 | 01111010 | 1.830 | 412 |
| 00011110 | 01111110 | 1.890 | 416 |
| 00011111 | 10000001 | 1.935 | 420 |
| 00100000 | 10000011 | 1.970 | 424 |
| 00100001 | 10000101 | 1.995 | 428 |
| 00100010 | 10001000 | 2.040 | 432 |
| 00100011 | 10001011 | 2.085 | 436 |
| 00100100 | 10010000 | 2.160 | 440 |
| 00100101 | 10010011 | 2.205 | 444 |
| 00100110 | 10010110 | 2.250 | 448 |
| 00100111 | 10011011 | 2.325 | 452 |
| 00101000 | 10100000 | 2.400 | 456 |
| 00101001 | 10100100 | 2.460 | 460 |
| 00101010 | 10101000 | 2.520 | 464 |
| 00101011 | 10101100 | 2.580 | 468 |
| 00101100 | 10110000 | 2.640 | 472 |
| 00101101 | 10110010 | 2.670 | 476 |
| 00101110 | 10110101 | 2.715 | 480 |
| 00101111 | 10111000 | 2.760 | 484 |
| 00110000 | 10111100 | 2.820 | 488 |
| 00110001 | 11000000 | 2.880 | 492 |
| 00110010 | 11000110 | 2.970 | 496 |

Thus, for example, when the eight-bit address supplied to the inputs of EPROM 29 is 00010011, the digital word provided at the outputs thereof will be 01001111. As a further example, when the eight-bit address supplied to the inputs of EPROM is 00101001, the digital word provided at the outputs thereof will be 10101000.

At this time, it should be noted that the eight-bit digital words stored in the memory of EPROM 29 were obtained from the voltage controlled oscillator output characteristic curve of FIG. 2. In addition, it should be noted that the eight bits of each eight-bit digital word stored in the memory of EPROM 29 represent respectively analog voltages of 0.015, 0.030, 0.060, 0.090, 0.120, 0.240, 0.480, 0.960, and 1.920 volts. As an example, when it is desired to obtain an output frequency from voltage controlled oscillator 36 of 275 megahertz, the input voltage required in accordance with FIG. 2 is 0.270 volts. Therefore, a 00010010 digital word must be stored in the memory of EPROM 29 to obtain a frequency of 275 megahertz at the output of voltage controlled oscillator 36.

Each eight-bit digital word provided at the outputs of EPROM 29 is, in turn, supplied to the inputs of digital-to-analog converter 33, which converts each of the above-mentioned digital words to an analog voltage or signal in accordance with the aforementioned illustrative table. As an example, if the eight-bit signal word supplied to the inputs of digital-to-analog converter 33 is 01100100, the analog voltage provided at the output thereof will be 1.5 volts.

The analog voltages provided by digital-to-analog converter 33 are supplied to the negative input of operational amplifier 35 which amplifies the aforementioned analog voltages to a more useful current level, before supplying the aforesaid analog voltages to voltage controlled oscillator 36. In addition, it should be noted that capacitor C1 eliminates from the analog voltages amplified by operational amplifier 35 any noise inherent therein, and resistor R1 provides the current amplification factor for operational amplifier 35.

Figure 5:
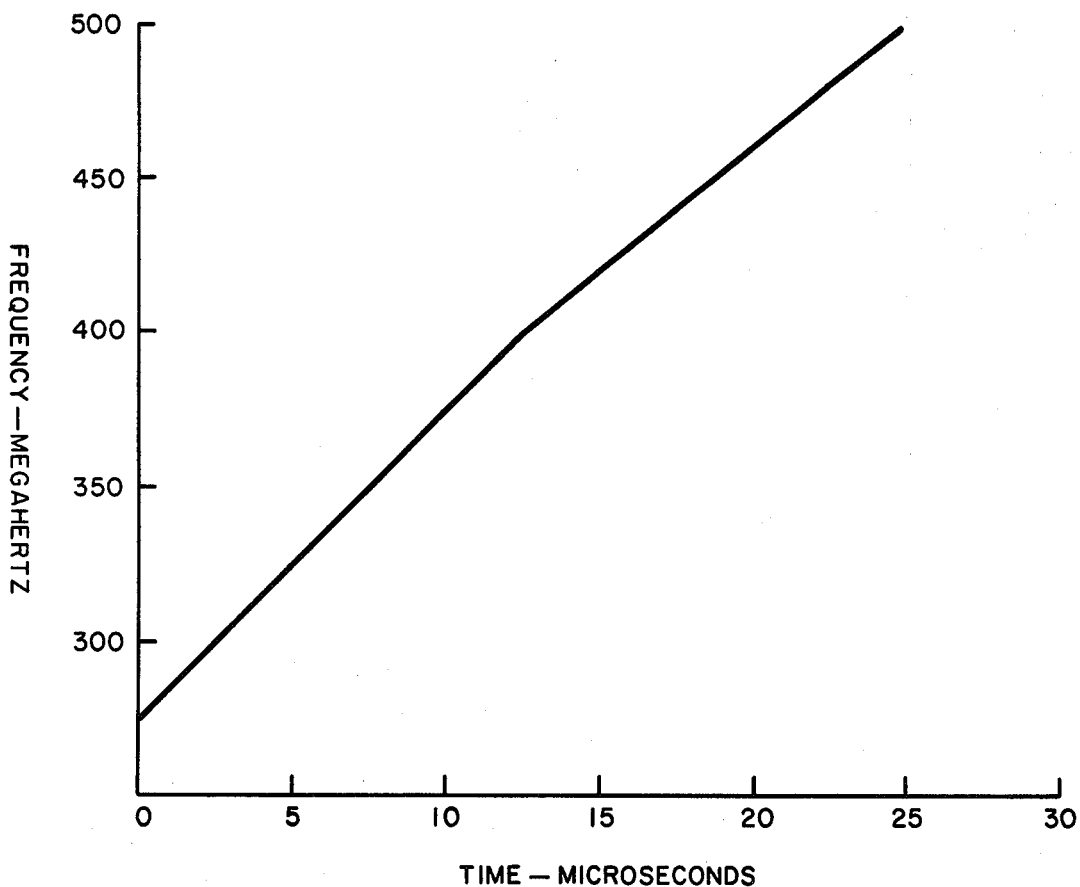
FIG. 5 is an output characteristic curve for the voltage controlled oscillator wherein the oscillator sweep output frequency varies as a function of time.

Upon receiving each analog voltage provided by digital-to-analog converter 33, voltage controlled oscillator 36 will provide at the output thereof a frequency signal in accordance with the aforesaid illustrative table. FIG. 5, in turn, depicts the oscillator sweep output frequency signal of voltage controlled oscillator 36 as a function of time during the twenty-five microsecond interval in which counters 23 and 25 are clocked by the fifty pulses 47 of FIG. 4D. With reference to FIG. 5, it may be observed that the oscillator sweep output frequency of voltage controlled oscillator 36 is linear as a function of time. In addition, it should be noted that the aforementioned frequency signal of voltage controlled oscillator 36 is repetitive and will cycle every 33 microseconds when the horizontal sync pulse of FIG. 4B resets counters 23 and 25 in the manner described above.

The oscillator sweep output frequency signal of voltage controlled oscillator 36 may then be supplied to a television system or the like for use thereby such that an image broadcast therefrom will be free from distortion.

From the foregoing, it may readily be seen that the subject invention comprise a new, unique, and exceedingly useful linearizing circuit for a voltage controlled oscillator which constitutes a considerable improvement over the known prior art. Obviously, many modifications and variations of the present invention are possible in light of the above teachings. It is, therefore, to be understood that within the scope of the appended claims, the invention may be practiced otherwise than a specifically described.

What is claimed is:

1. A linearizing circuit comprising, in combination:
an input terminal adapted to receive a horizontal sync signal having a series of uniformly spaced horizontal sync pulses;

timing means having an input connected to said input terminal and a plurality of outputs, for producing a plurality of digital addresses, said plurality of digital addresses to be repetitive whenever said timing means receives at the input thereof one of the sync pulses of said horizontal sync signal, said timing means comprising;

a variable frequency clock having an output;

a first NAND gate having a first input connected to said input terminal, a second input, and an output;

a direct current voltage source having an output connected to the second input of said first NAND gate;

a second NAND gate having a first input connected to the output of said first NAND gate, a second input connected to the output of said variable frequency clock, and an output;

a third NAND gate having a first input connected to the output of said second NAND gate, a second input, and an output;

a first counter having a clock input connected to the output of said third NAND gate, a reset input connected to the output of said first NAND gate, an enable output, and four data outputs;

a second counter having a clock input connected to the output of said third NAND gate, a reset input connected to the output of said first NAND gate, an enable input connected to the enable output of said first counter, and four data outputs;

a fourth NAND gate having a first input connected to the second data output of said first counter, a second input connected to the first data output of said second counter, a third input connected to the second data output of said second counter, and an output connected to the second input of said third NAND gate;

memory means having a plurality of inputs effectively connected to the outputs of said timing means and plurality of outputs, for providing, in response to each digital address produced by said timing means, a digital word;

means having a plurality of inputs effectively connected to the outputs of said memory means, and an output for converting each digital word provided by said memory means to an analog voltage; and voltage controlled oscillator means having an input connected to the output of said converting means and an output, for providing at the output thereof a frequency signal in response to each of said analog voltages such that a linear oscillator sweep output frequency signal is formed at the output of said voltage controlled oscillator means between successive sync pulses of said horizontal sync signal.

2. The circuit of claim 1 wherein the frequency of the sync pulses of said horizontal sync signal is fifteen kilohertz.

3. The circuit of claim 1 wherein the frequency of the sync pulses of said horizontal sync signal is thirty kilohertz.

4. The circuit of claim 1 wherein said digital addresses are produced by said timing means at a frequency of two megahertz.

5. The circuit of claim 1 wherein each digital address produced by said timing means comprises an eight-bit digital address.

6. The circuit of claim 1 wherein said memory means comprises an erasable programmable read only memory.

7. The circuit of claim 1 wherein each of the digital words provided by said memory means comprises an eight-bit digital word.

8. The circuit of claim 1 further characterized by:

an operational amplifier connected between the output of said converting means and the input of said voltage controlled oscillator means; and the parallel combination of a resistor and a capacitor connected between the input and output of said operational amplifier.

9. A system for linearizing a voltage-controlled oscillator comprising, in combination:

an input terminal;

a variable frequency clock having an output;

a first NAND gate having a first input connected to said input terminal, a second input, and an output;

a direct current voltage source having an output connected to the second input of said first NAND gate;

a second NAND gate having a first input connected to the output of said first NAND gate, a second input connected to the output of said variable frequency clock, and an output;

a third NAND gate having a first input connected to the output of said second NAND gate, a second input and an output;

a first counter having a clock input connected to the output of said third NAND gate, a reset input connected to the output of said first NAND gate, an enable output and four data outputs;

a second counter having a clock input connected to the output of said third NAND gate, a reset input connected to the output of said first NAND gate, an enable input connected to the enable output of said first counter and four data outputs;

a fourth NAND gate having a first input connected to the second data output of said first counter, a second input connected to the first data output of said second counter, a third input connected to the second data output of said second counter and an output connected to the second input of said third NAND gate;

an erasable programmable read only memory having eight inputs, four inputs of which are respectively connected to the four data outputs of said first counter, and four inputs of which are respectively connected to the four data outputs of said second counter, and eight outputs;

a digital-to-analog converter having eight inputs respectively connected to the eight outputs of said erasable programmable read only memory, and an output;

an operational amplifier having an input connected to the output of said digital-to-analog converter and an output;

the parallel combination of a resistor and a capacitor connected between the input and the output of said operational amplifier; and said voltage controlled oscillator having an input connected to the output of said operational amplifier.

* * * * *